US010553632B2

(12) United States Patent
Ma

(10) Patent No.: US 10,553,632 B2
(45) Date of Patent: Feb. 4, 2020

(54) PHOTOELECTRIC DETECTION DEVICE AND PHOTOELECTRIC DETECTION APPARATUS

(71) Applicant: BOE Technology Group Co., Ltd., Beijing (CN)

(72) Inventor: Zhanjie Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/811,960

(22) Filed: Nov. 14, 2017

(65) Prior Publication Data
US 2018/0190701 A1 Jul. 5, 2018

(30) Foreign Application Priority Data
Jan. 3, 2017 (CN) .......................... 2017 1 0002778

(51) Int. Cl.
H01L 27/146 (2006.01)
(52) U.S. Cl.
CPC .. H01L 27/14629 (2013.01); H01L 27/14623 (2013.01); H01L 27/14685 (2013.01)
(58) Field of Classification Search
CPC combination set(s) only.
See application file for complete search history.

(56) References Cited

U.S. PATENT DOCUMENTS

| 2012/0038013 A1 | 2/2012 | Karim et al. |
| 2012/0050554 A1 | 3/2012 | Levine et al. |
| 2015/0244958 A1* | 8/2015 | Ohguro ............... H04N 5/374 348/277 |

FOREIGN PATENT DOCUMENTS

| CN | 1141511 A | 1/1997 |
| CN | 1250230 A | 4/2000 |
| CN | 105093259 A | 11/2015 |
| CN | 105097860 A | 11/2015 |
| CN | 105679842 A | 6/2016 |
| CN | 106252454 A | 12/2016 |
| KR | 1020130098037 A | 9/2013 |
| WO | 2013142815 A1 | 9/2013 |

OTHER PUBLICATIONS

First Office Action dated Jan. 28, 2019 corresponding to Chinese application No. 201710002778.X.

* cited by examiner

Primary Examiner — Ratisha Mehta
(74) Attorney, Agent, or Firm — Nath, Goldberg & Meyer; Joshua B. Goldberg; Daniel J. Bissing

(57) ABSTRACT

The present disclosure provides a photoelectric detection device and a photoelectric detection apparatus. The photoelectric detection device includes a substrate, a reflective structure provided on the substrate and a photoelectric conversion layer provided on the reflective structure, and has a plurality of pixel regions and a plurality of interval regions each provided between two adjacent pixel regions. The photoelectric conversion layer includes a pixel photoelectric conversion portion in the pixel region; the reflective structure includes a pixel reflective portion in the pixel region and an interval reflective portion in the interval region, and the interval reflective portion is configured to reflect light directed to the interval reflective portion from the pixel photoelectric conversion portion back to the pixel photoelectric conversion portion.

16 Claims, 2 Drawing Sheets

PHOTOELECTRIC DETECTION DEVICE AND PHOTOELECTRIC DETECTION APPARATUS

CROSS-REFERENCE TO RELATED APPLICATION

This application claims the benefit of priority to China Patent Application No. 201710002778.X filed on Jan. 3, 2017, the contents of which are incorporated herein in their entirety by reference.

TECHNICAL FIELD

The present disclosure relates to the field of photoelectric detection technology, and specifically relates to a photoelectric detection device and a photoelectric detection apparatus.

BACKGROUND

An existing photoelectric detection device generally includes a photoelectric conversion layer and a reflective layer having high reflectivity provided below the photoelectric conversion layer. Light obliquely incident into a certain pixel region may enter into another pixel region after being reflected by the reflective layer and an electrode.

SUMMARY

In one aspect, the present disclosure provides a photoelectric detection device, comprising a substrate, a reflective structure provided on the substrate and a photoelectric conversion layer provided on the reflective structure, and having a plurality of pixel regions and a plurality of interval regions each provided between two adjacent pixel regions, wherein the photoelectric conversion layer comprises a first photoelectric conversion portion (i.e., pixel conversion portion) in the pixel region; the reflective structure comprises a first reflective portion (i.e., pixel reflective portion) in the pixel region and a second reflective portion (i.e., interval reflective portion) in the interval region, and the second reflective portion is configured to reflect light directed to the second reflective portion from the first photoelectric conversion portion back to the first photoelectric conversion portion.

Optionally, a reflective surface of the second reflective portion protrudes towards the photoelectric conversion layer as a whole.

Optionally, the reflective surface of the second reflective portion comprises a first reflective surface and a second reflective surface, which are respectively connected to reflective surfaces of the first reflective portions on both sides of the second reflective portion, and the reflective surface of the first reflective portion is parallel to a surface of the substrate; each of the first reflective surface and the second reflective surface inclines with respect to the reflective surface of the first reflective portion connected thereto as a whole.

Optionally, each of the first reflective surface and the second reflective surface is a plane surface; an angle between the first reflective surface and the reflective surface of the first reflective portion connected to the first reflective surface is an obtuse angle, and an angle between the second reflective surface and the reflective surface of the first reflective portion connected to the second reflective surface is an obtuse angle.

Optionally, each of the first reflective surface and the second reflective surface is a curved surface.

Optionally, each of the first reflective surface and the second reflective surface of the second reflective portion includes a plurality of first reflective sub-surfaces and a plurality of second reflective sub-surfaces arranged side by side in an alternate manner, the reflective surface of the first reflective portion is connected to the first reflective sub-surface of one of the first reflective surface and the second reflective surface of the second reflective portion; and the first reflective sub-surfaces and the second reflective sub-surfaces are configured such that light directed to the first reflective sub-surface from the first photoelectric conversion portion is reflected back to the first photoelectric conversion portion, by the first reflective sub-surface directly or after being reflected multiple times between the first reflective sub-surface and the second reflective sub-surface adjacent to the first reflective sub-surface; and light directed to the second reflective sub-surface from the first photoelectric conversion portion is reflected back to the first photoelectric conversion portion after being reflected multiple times between the second reflective sub-surface and the first reflective sub-surface adjacent to the second reflective sub-surface.

Optionally, the reflective structure comprises a reflective film layer covering the entire substrate and protrusions in the interval regions, a part of the reflective film layer in the pixel region is provided on a surface of the substrate to form the first reflective portion, and a part of the reflective film layer in the interval region is provided on a surface of the protrusion to form the second reflective portion together with the protrusion.

Optionally, the reflective film layer is made of a metal material.

Optionally, the protrusion is made of a photosensitive material.

Optionally, the photosensitive material includes photosensitive polyimide.

Optionally, the photoelectric conversion layer further comprises second photoelectric conversion portions (i.e., interval conversion portions) each between two adjacent first photoelectric conversion portions, and the first photoelectric conversion portions and the second photoelectric conversion portions form a continuous film layer.

Optionally, the photoelectric detection device further comprises a light blocking member provided on the second reflective portion, and any two adjacent first photoelectric conversion portions are spaced apart from each other by the light blocking member.

Optionally, the photoelectric detection device further comprises a common electrode in the interval region and a pixel electrode in the pixel region, the common electrode and the pixel electrode being insulated and spaced apart from each other.

Optionally, the common electrode and the pixel electrode are both provided on the photoelectric conversion layer.

Optionally, the common electrode and the pixel electrode are both made of a metal material.

Optionally, the photoelectric detection device further comprises a transparent planarization layer between the reflective structure and the photoelectric conversion layer.

Accordingly, the present disclosure further provides a photoelectric detection apparatus, comprising the above described photoelectric detection device.

In another aspect, the present disclosure further provides a method of fabricating a photoelectric detection device, the photoelectric detection device having a plurality of pixel regions and a plurality of interval regions each provided between two adjacent pixel regions, the method comprising: providing a substrate; forming a reflective structure on the substrate, the reflective structure comprising a first reflective portion in the pixel region and a second reflective portion in the interval region; forming a photoelectric conversion layer on a side of the reflective structure distal to the substrate, the photoelectric conversion layer comprising a first photoelectric conversion portion in the pixel region; wherein, the second reflective portion is configured to reflect light directed to the second reflective portion from the first photoelectric conversion portion back to the first photoelectric conversion portion.

BRIEF DESCRIPTION OF THE DRAWINGS

The accompanying drawings, which serve to provide a further understanding of the present disclosure and constitute a part of this specification, are used for explaining the present disclosure together with the following specific implementations, rather than limiting the present disclosure. In the drawings.

DETAILED DESCRIPTION

Specific implementations of the present disclosure will be further described in detail below in conjunction with the accompanying drawings. It should be understood that, the specific implementations described herein are merely used for describing and explaining the present disclosure, rather than limiting the present disclosure.

Figure 1:
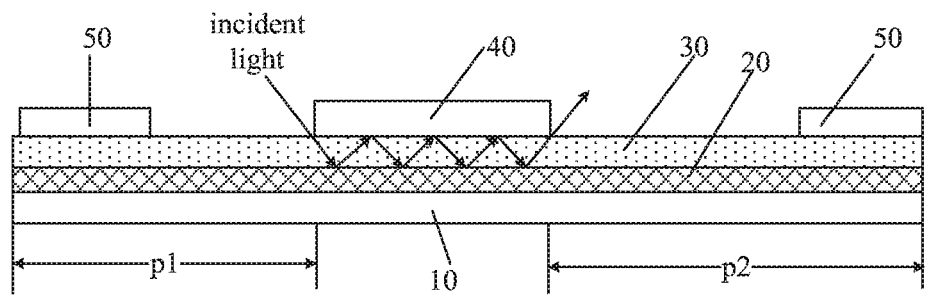
FIG. 1 is a schematic structure diagram of a photoelectric detection device.

FIG. 1 is a schematic structure diagram of a photoelectric detection device. As shown in FIG. 1, the photoelectric detection device includes a substrate 10, a photoelectric conversion layer 30 provided on the substrate 10, a common electrode 40, a pixel electrode 50 and a scintillation layer (not shown). During detection, a common signal is applied onto the common electrode 40, a reference signal is applied onto the pixel electrode 50, X-rays are converted into natural light after passing through the scintillation layer, and the natural light is incident into the photoelectric conversion layer 30 and converted into electrons, so that a signal on the pixel electrode 50 in a corresponding pixel region changes, thus generating a detection signal. In order to improve conversion efficiency of the photoelectric conversion layer 30, a reflective layer 20 having high reflectivity is generally provided below the photoelectric conversion layer 30 to increase the possibility of absorption of light by the photoelectric conversion layer 30. Due to the uniformity issue in vertical distribution of columnar crystals in the scintillation layer, however, not all of the converted light is perpendicularly incident into the photoelectric conversion layer 30. Thus, as shown in FIG. 1, light incident into a pixel region p1 on the left (also referred to as left pixel region p1) will enter into a pixel region p2 on the right (also referred to as right pixel region p2) after being reflected by both the reflective layer 20 and the common electrode 40, which causes crosstalk among detection signals in different pixel regions and affects detection effect.

Figure 2:
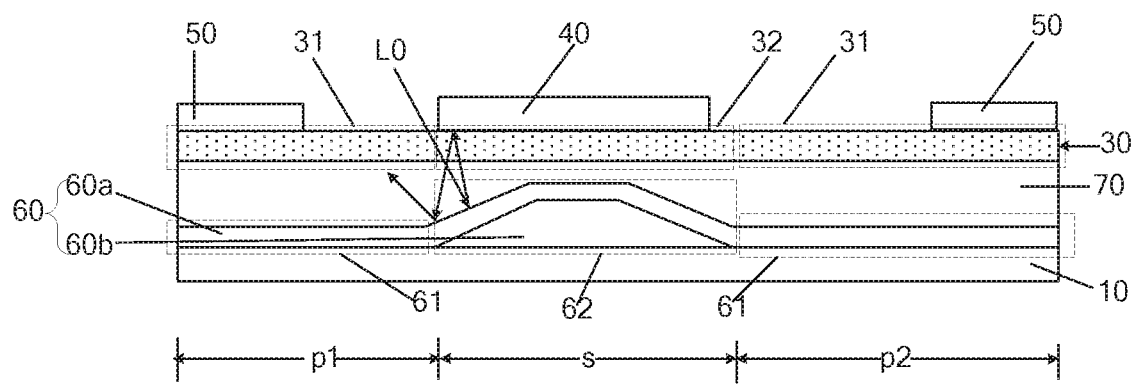
FIG. 2 is a schematic structure diagram of a photoelectric detection device provided in an embodiment of the present disclosure.
Figure 3:
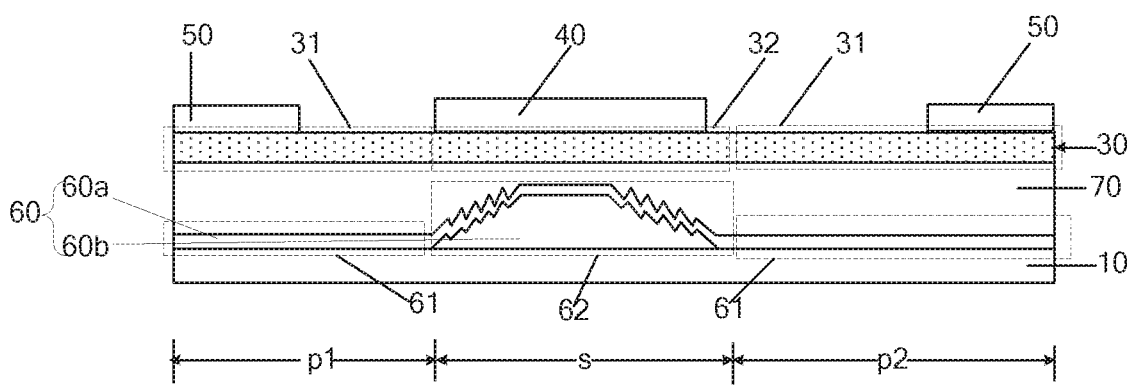
FIG. 3 is a schematic structure diagram of a photoelectric detection device provided in an embodiment of the present disclosure.
Figure 5:
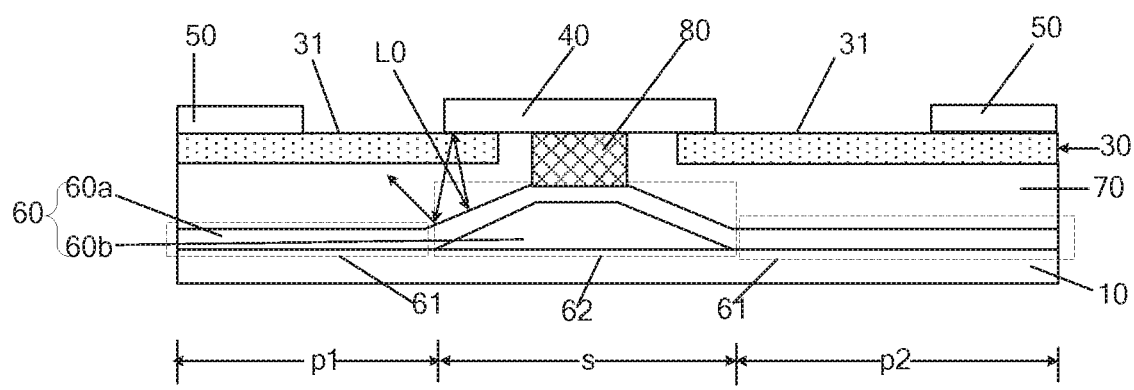
FIG. 5 is a schematic structure diagram of a photoelectric detection device provided in an embodiment of the present disclosure.

As an aspect of the present disclosure, there is provided a photoelectric detection device, and as shown in FIGS. 2, 3 and 5, the photoelectric detection device includes a substrate 10, a reflective structure 60 provided on the substrate 10, and a photoelectric conversion layer 30 provided on the reflective structure 60. The photoelectric detection device is divided into a plurality of pixel regions (such as a pixel region p1 on the left and a pixel region p2 on the right as shown in FIG. 2) and interval regions s between every two adjacent pixel regions. The photoelectric conversion layer 30 includes a pixel conversion portion 31 in the pixel region. The reflective structure 60 includes a pixel reflective portion 61 in the pixel region and an interval reflective portion 62 in the interval region s. The interval reflective portion 62 is configured to reflect light directed to the interval reflective portion 62 from the pixel conversion portion 31 back to the pixel conversion portion 31. It should be understood that, the "light directed to the interval reflective portion 62 from the pixel conversion portion 31" described herein is not generated by the pixel conversion portion 31, but refers to light which is emitted from the outside of the pixel conversion portion 31, passes through the pixel conversion portion 31 and is then directed to the interval reflective portion 62.

According to some embodiments of the present disclosure, the interval reflective portion 62 has a reflective surface protruding towards the photoelectric conversion layer 30 as a whole.

As shown in FIG. 2, when light L0 is incident into the photoelectric detection device obliquely (i.e., at a certain angle with respect to a perpendicular direction), the light L0 is directed to the interval reflective portion 62 between the left pixel region p1 and the right pixel region p2, after passing through the pixel conversion portion 31 in the left pixel region p1. In this case, the interval reflective portion 62 reflects all of the light back to the pixel conversion portion 31 in the left pixel region p1, for example, through the protruding reflective surface thereof, rather than to the pixel conversion portion 31 in other pixel region. In this way, detection signals in different pixel regions are prevented from interfering with each other, and detection accuracy is improved. Similarly, light is directed to the interval reflective portion 62 after passing through the pixel conversion portion 31 in the right pixel region p2. In this case, the interval reflective portion 62 reflects all of the light back to the pixel conversion portion 31 in the right pixel region p2, for example, through the protruding reflective surface thereof. The "perpendicular direction" described herein refers to a thickness direction of the photoelectric detection device.

Specifically, as shown in FIGS. 2 and 5, the reflective surface of the interval reflective portion 62 includes a first reflective surface and a second reflective surface (i.e., two inclined surfaces of the interval reflective portion 62 in FIGS. 2 and 5), which are respectively connected to reflective surfaces of the pixel reflective portions 61 on both sides of the interval reflective portion 62. In some embodiments, the reflective surface of the pixel reflective portion is parallel to the surface of the substrate; each of the first reflective surface and the second reflective surface inclines with respect to the reflective surface of the pixel reflective portion as a whole. For example, as shown in FIG. 2, the first reflective surface is connected to the reflective surface of the pixel reflective portion 61 in the left pixel region p1, and the second reflective surface is connected to the reflective surface of the pixel reflective portion 61 in the right pixel region p2; when light L0 from the pixel conversion portion 31 in the left pixel region p1 is directed to the first reflective surface at a certain angle with respect to the perpendicular direction, the inclined first reflective surface reflects the received light back to the pixel conversion portion 31 in the left pixel region p1; similarly, when light from the pixel conversion portion 31 in the right pixel region p2 is directed to the second reflective surface at a certain angle with respect to the perpendicular direction, the inclined second reflective surface reflects the received light back to the pixel conversion portion 31 in the right pixel region p2.

According to some embodiments of the present disclosure, each of the first reflective surface and the second reflective surface is a plane surface; an angle between the first reflective surface and the reflective surface of the pixel reflective portion 61 adjacent to the first reflective surface is an obtuse angle, and an angle between the second reflective surface and the reflective surface of the pixel reflective portion 61 adjacent to the second reflective surface is an obtuse angle. Optionally, the obtuse angles are in the range of 130 degrees to 150 degrees, so that the first reflective surface and the second reflective surface have relatively large areas and thus have improved reflective effect in the case of a fixed height of the pixel reflective portion 31.

In some embodiments, each of the first reflective surface and the second reflective surface is a curved surface. For example, the first reflective surface and the second reflective surface may be convex or concave arc surfaces, or zigzag surfaces.

Figure 4:
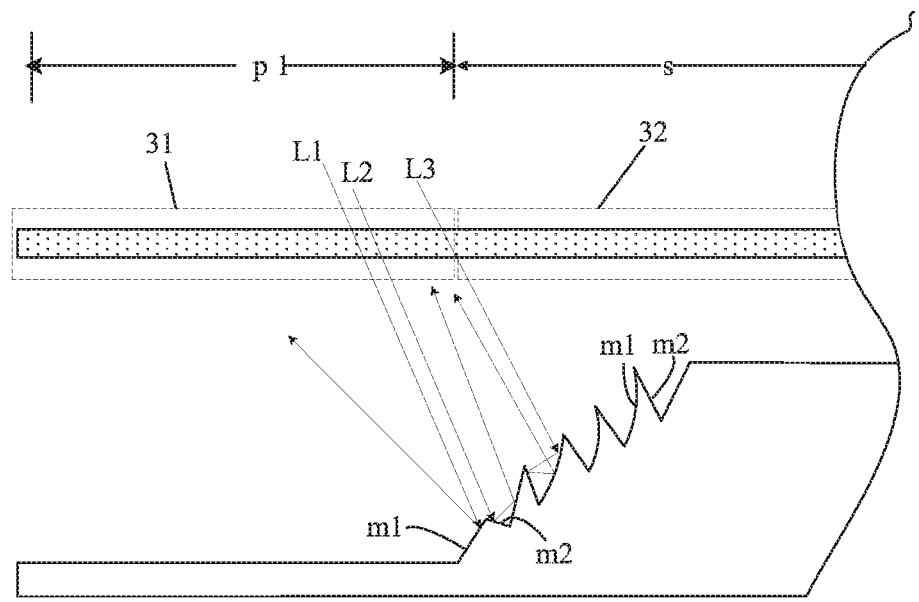
FIG. 4 is a schematic diagram illustrating that a first reflective surface of an interval reflective portion of the photoelectric detection device in FIG. 3 reflects light.

FIG. 3 is a schematic structure diagram of a photoelectric detection device provided in an embodiment of the present disclosure, and FIG. 4 is a schematic diagram illustrating that the first reflective surface of the interval reflective portion 62 in FIG. 3 reflects light. It can be understood that, in order to illustrate the reflection process of light more clearly, FIG. 4 illustrates only a part of the structure in FIG. 3. Referring to FIGS. 3 and 4, each of the first reflective surface and the second reflective surface includes a plurality of first reflective sub-surfaces m1 and a plurality of second reflective sub-surfaces m2, the first reflective sub-surfaces m1 and the second reflective sub-surfaces m2 are arranged side by side in an alternate manner, and the reflective surface of the pixel reflective portion 61 is connected to a first reflective sub-surface m1 of one of the first reflective surface and the second reflective surface of the interval reflective portion 62. The first reflective sub-surfaces m1 and the second reflective sub-surfaces m2 are arranged such that light directed to the first reflective sub-surface m1 from the pixel conversion portion 31 can be reflected back to the pixel conversion portion 31, directly by the first reflective sub-surface m1 or after being reflected multiple times between the first reflective sub-surface m1 and adjacent second reflective sub-surface m2; and light directed to the second reflective sub-surface m2 from the pixel conversion portion 31 can be reflected back to the pixel conversion portion 31 after being reflected multiple times between the second reflective sub-surface m2 and adjacent first reflective sub-surface m1. In some embodiments, the first reflective sub-surfaces m1 and the second reflective sub-surfaces m2 may be plane surfaces or curved surfaces (such as convex or concave surfaces). In some embodiments, the first reflective sub-surface m1 connected to the pixel reflective portion 61 is a plane surface, and an angle between the reflective surface of the pixel reflective portion 61 and each first reflective sub-surface m1 adjacent to the pixel reflective portion 61 is an obtuse angle.

As shown in FIG. 4, light L1, L2 and L3 from the pixel conversion portion 31 in the left pixel region p1 is directed to the first reflective surface of the interval reflective portion 62 at certain angles with respective to the perpendicular direction. When being directed to the first reflective sub-surface m1 of the first reflective surface, the light L1 is reflected back to the pixel conversion portion 31 in the left pixel region p1 by the first reflective sub-surface m1; when being directed to the second reflective sub-surface m2 of the first reflective surface, the light L2 is reflected to the adjacent first reflective sub-surface m1 by the second reflective sub-surface m2, and then reflected back to the pixel conversion portion 31 in the left pixel region p1 by the first reflective sub-surface m1; when being directed to the first reflective sub-surface m1 of the first reflective surface, the light L3 is reflected multiple times between the first reflective sub-surface m1 and the adjacent second reflective sub-surface m2, and finally reflected back to the pixel conversion portion 31 in the left pixel region p1 by the first reflective sub-surface m1. When light from the pixel conversion portion 31 in the right pixel region p2 is directed to the second reflective surface, the reflection process is similar to those of the light L1, L2 and L3, and is not described repeatedly herein. Compared to the structure shown in FIG. 2, the structure having the first reflective surface and the second reflective surface shown in FIG. 3 can have increased reflective area, and thus can further increase light utilization while preventing signal interference among different pixel regions.

In some embodiments, as shown in FIGS. 2 and 3, the reflective structure 60 includes a reflective film layer 60*a* that covers the entire substrate 10 and protrusions 60*b* each in one of the interval regions s. The part of the reflective film layer 60*a* in the pixel region is provided on the surface of the substrate 10 to form the pixel reflection portion 61; the part of the reflective film layer 60*a* in the interval region s is provided on the surface of the protrusion 60*b* to form the interval reflective portion 62 together with the protrusion 60*b*.

In some embodiments, the reflective film layer 60*a* may be made of a metal material, such as silver, copper, aluminum, or the like. In some embodiments, the protrusion 60*b* may be made of a photosensitive material. In fabrication, a pattern including a plurality of protrusions 60*b* may be formed through exposure and development, and then, the reflective film layer may be formed through sputtering or the like. In this way, the reflective structure 60 can be formed without etching, which simplifies process steps. In some embodiments, the photosensitive material includes polyimide.

It can be understood that, when the reflective structure 60 includes the reflective film layer 60*a* and the protrusion 60*b*, the reflective film layer 60*a* may be an even metal film layer formed by sputtering, and thus, by designing the shape of the protrusion 60*b*, the overall shape of the reflective structure 60 can be changed such that the first reflective surface and the second reflective surface thereof are formed as flat surfaces shown in FIG. 2 or the zigzag surfaces shown in FIG. 3. In some embodiments, the protrusion 60*b* may be made of the same metal material as the reflective film layer 60*a*, so that the reflective structure 60 is formed as an integral structure.

In some embodiments of the present disclosure, as shown in FIGS. 2 and 3, in addition to the pixel conversion portions 31 in the pixel regions, the photoelectric conversion layer 30 includes interval conversion portions 32 each between any two adjacent pixel conversion portions 31, the pixel conversion portions 31 and the interval conversion portions 32 forming a continuous film layer. In fabrication, the photoelectric conversion layer 30 may be formed by directly depositing or coating a continuous film without patterning process.

In some embodiments of the present disclosure, as shown in FIG. 5, the photoelectric detection device further includes a light blocking member provided on the interval reflective portion 62. In this case, any two adjacent pixel conversion portions 31 are spaced apart from each other by the light blocking member 80. The light blocking member 80 can further prevent crosstalk of light between two adjacent pixel regions, and thus can further prevent crosstalk between signals in two adjacent pixel regions. It should be understood that, when the reflective surface of the interval reflective portion 62 includes the first reflective surface and the second reflective surface, the light blocking member 80 should be provided in such a manner that light reflecting effects of the first reflective surface and the second reflective surface are not affected. As shown in FIG. 5, the first reflective surface and the second reflective surface of the interval reflective portion 62 are two inclined surfaces of the interval reflective portion 62 in FIG. 5, and in this case, the light blocking member 80 is provided on the top surface of the interval reflective portion 62. Needless to say, in the case where the reflective structure has the structure shown in FIG. 3, the light blocking member may also be provided.

In some embodiments of the present disclosure, as shown in FIGS. 2, 3 and 5, the photoelectric detection device further includes a common electrode 40 in the interval region s and a pixel electrode 50 in the pixel region, the common electrode 40 and the pixel electrode 50 being insulated and spaced apart from each other. A projection of the common electrode 40 on the substrate 10 may be within a projection of the interval reflective portion 62 on the substrate 10, or beyond the projection of the interval reflective portion 62 on the substrate 10, or completely overlap with the projection of the interval reflective portion 62 on the substrate 10, which is not particularly limited herein. When performing photoelectric detection, a common signal is applied onto the common electrode 40, a reference signal is applied onto the pixel electrode 50, and when being incident into the pixel conversion portion 31 in the pixel region (e.g., p1 or p2), light is converted into electrons, which changes a voltage on the pixel electrode 50, i.e., results in a detection signal, which can be further used to determine intensity of the light.

Specifically, both the common electrode 40 and the pixel electrode 50 are provided on the photoelectric conversion layer 30. In some embodiments, the common electrode 40 and the pixel electrode 50 are made of a same material, so that the common electrode 40 and the pixel electrode 50 can be formed in one patterning process, thus reducing process steps. In some embodiments, the common electrode 40 and the pixel electrode 50 may be each made of a metal material, so that they can reflect light. It should be noted that, in the case where the common electrode 40 and the pixel electrode 50 are made of a metal material, the above description that "the interval reflective portion 62 is configured to reflect light directed to the interval reflective portion 62 from the pixel conversion portion 31 back to the pixel conversion portion 31" means the light directed to the interval reflective portion 62 from the pixel conversion portion 31 can finally be directed back to the pixel conversion portion 31 after being reflected by the interval reflective portion 62 and the common electrode 40, thus further improving light utilization.

In some embodiments of the present disclosure, as shown in FIGS. 2, 3 and 5, a transparent planarization layer 70 is further provided between the reflective structure 60 and the photoelectric conversion layer 30, so that the photoelectric conversion layer 30 is provided on a flat surface, which facilitates photoelectric conversion.

In the case where the photoelectric conversion layer 30 has the structure shown in FIG. 5, the planarization layer 70 is divided by the light blocking member 80 into a plurality of portions. In order that the common electrode 40 and the pixel electrode 50 are provided on a flat surface, in fabrication of a plurality of pixel conversion portions 31, a part of the pixel conversion portion 31 may extend to the interval region s, so that the surface of the pixel conversion portion 31 distal to the substrate 10 and the surface of the light blocking member 80 distal to the substrate 10 together form a flat surface (there is no gap between the pixel conversion portion 31 and the light blocking member 80); alternatively, in the case where there is a gap between the pixel conversion portion 31 and the light blocking member 80, a filling block may be provided in the gap such that the surface of the pixel conversion portion 31 distal to the substrate 10, the surface of the filling block distal to the substrate 10 and the surface of the light blocking member 80 distal to the substrate 10 together form a flat surface.

Fabrication process of the photoelectric detection device according to some embodiments of the present disclosure will be described below.

In a first step, a photosensitive polyimide layer is formed on the substrate 10, and is exposed and developed to form the protrusion 60b in the interval region s. Side surfaces of the protrusion 60b may be plane surfaces shown in FIG. 2, or zigzag surfaces shown in FIG. 3.

In a second step, the reflective film layer 60a is formed using a metal material on the substrate 10 with the protrusion 60b formed thereon, such that the part of the reflective film layer 60a in the pixel region is formed on the substrate 10 to serve as the pixel reflective portion 61, and the part of the reflective film layer 60a in the interval region s is formed on the protrusion 60b to serve as the interval reflective portion 62 together with the protrusion 60b.

In a third step, the transparent planarization layer 70 is formed. The material for forming the planarization layer 70 may also be polyimide.

In a fourth step, the photoelectric conversion layer 30 is formed.

In a fifth step, a metal material layer is formed, and is patterned to form a pattern including the pixel electrode 50 and the common electrode 40. The pixel electrode 50 is in the pixel region and the common electrode 40 is in the interval region s between two adjacent pixel regions.

After the common electrode 40 and the pixel electrode 50 are formed, a protection layer may be formed to prevent the common electrode 40 and the pixel electrode 50 from being corroded by subsequent fabrication process.

As another aspect of the present disclosure, there is provided a photoelectric detection apparatus including the above photoelectric detection device.

In the present disclosure, when light is incident into the photoelectric detection device obliquely (e.g., at a certain angle with respect to the perpendicular direction), the light is directed to the interval reflective portion between the left and right pixel regions after passing through the pixel conversion portion in the left pixel region, at this point, the interval reflective portion reflects the light back to the pixel conversion portion in the left pixel region, so that the light will not be directed to the pixel conversion portion in other pixel region, thus preventing detection signals in different pixel regions from interfering with each other and further improving detection accuracy of the photoelectric detection apparatus. In addition, the reflective structure includes a plurality of protrusions and a reflective film layer, the protrusions may be made by exposure and development, and the reflective film layer may be formed by sputtering, thus omitting etching and reducing process steps.

It could be understood that the above embodiments are merely exemplary embodiments adopted for describing the principle of the present disclosure, but the present disclosure is not limited thereto. Various variations and improvements may be made by those of ordinary skill in the art without departing from the spirit and essence of the present disclosure, and these variations and improvements shall also be regarded as falling into the protection scope of the present disclosure.

The invention claimed is:

1. A photoelectric detection device, comprising a substrate, a reflective structure provided on the substrate and a photoelectric conversion layer provided on the reflective structure, and having a plurality of pixel regions and a plurality of interval regions each provided between two adjacent pixel regions,
    wherein the photoelectric conversion layer comprises a first photoelectric conversion portion in the pixel region; the reflective structure comprises a first reflective portion in the pixel region and a second reflective portion in the interval region, and the second reflective portion is configured to reflect light directed to the second reflective portion from the first photoelectric conversion portion back to the first photoelectric conversion portion,
    wherein a reflective surface of the second reflective portion protrudes towards the photoelectric conversion layer as a whole and comprises a first reflective surface and a second reflective surface, which are respectively connected to a reflective surface of the first reflective portion on both sides of the second reflective portion, and
    the reflective surface of the first reflective portion is parallel to a surface of the substrate; each of the first reflective surface and the second reflective surface inclines with respect to the reflective surface of the first reflective portion connected thereto as a whole.

2. The photoelectric detection device of claim 1, wherein each of the first reflective surface and the second reflective surface is a plane surface; and
    an angle between the first reflective surface and the reflective surface of the first reflective portion connected to the first reflective surface is an obtuse angle, and an angle between the second reflective surface and the reflective surface of the first reflective portion connected to the second reflective surface is an obtuse angle.

3. The photoelectric detection device of claim 1, wherein each of the first reflective surface and the second reflective surface is a curved surface.

4. The photoelectric detection device of claim 1, wherein each of the first reflective surface and the second reflective surface of the second reflective portion comprises a plurality of first reflective sub-surfaces and a plurality of second reflective sub-surfaces arranged side by side in an alternate manner, the reflective surface of the first reflective portion is connected to the first reflective sub-surface of one of the first reflective surface and the second reflective surface of the second reflective portion; and
    the first reflective sub-surfaces and the second reflective sub-surfaces are configured such that light directed to the first reflective sub-surface from the first photoelectric conversion portion is reflected back to the first photoelectric conversion portion, by the first reflective sub-surface directly or after being reflected multiple times between the first reflective sub-surface and the second reflective sub-surface adjacent to the first reflective sub-surface; and light directed to the second reflective sub-surface from the first photoelectric conversion portion is reflected back to the first photoelectric conversion portion after being reflected multiple times between the second reflective sub-surface and the first reflective sub-surface adjacent to the second reflective sub-surface.

5. The photoelectric detection device of claim 1, wherein the reflective structure comprises protrusions in the interval regions and a reflective film layer covering the protrusions, a part of the reflective film layer in the pixel region is provided on a surface of the substrate to form the first reflective portion, and a part of the reflective film layer in the interval region is provided on a surface of the protrusion to form the second reflective portion together with the protrusion.

6. The photoelectric detection device of claim 5, wherein the reflective film layer is made of a metal material.

7. The photoelectric detection device of claim 5, wherein the protrusion is made of a photosensitive material.

8. The photoelectric detection device of claim 7, wherein the photosensitive material comprises photosensitive polyimide.

9. The photoelectric detection device of claim 1, wherein the photoelectric conversion layer further comprises second photoelectric conversion portions each between two adjacent first photoelectric conversion portions, and the first photoelectric conversion portions and the second photoelectric conversion portions form a continuous film layer.

10. The photoelectric detection device of claim 1, further comprising a light blocking member provided on the second reflective portion, wherein any two adjacent first photoelectric conversion portions are spaced apart from each other by the light blocking member.

11. The photoelectric detection device of claim 1, further comprising a common electrode in the interval region and a pixel electrode in the pixel region, the common electrode and the pixel electrode being insulated and spaced apart from each other.

12. The photoelectric detection device of claim 11, wherein the common electrode and the pixel electrode are both provided on the photoelectric conversion layer.

13. The photoelectric detection device of claim 11, wherein the common electrode and the pixel electrode are both made of a metal material.

14. The photoelectric detection device of claim 1, further comprising a transparent planarization layer between the reflective structure and the photoelectric conversion layer.

15. A photoelectric detection apparatus, comprising the photoelectric detection device of claim 1.

16. A method of fabricating a photoelectric detection device, the photoelectric detection device having a plurality of pixel regions and a plurality of interval regions each provided between two adjacent pixel regions, the method comprising:
    providing a substrate;

forming a reflective structure on the substrate, the reflective structure comprising a first reflective portion in the pixel region and a second reflective portion in the interval region;

forming a photoelectric conversion layer on a side of the reflective structure distal to the substrate, the photoelectric conversion layer comprising a first photoelectric conversion portion in the pixel region;

wherein, the second reflective portion is configured to reflect light directed to the second reflective portion from the first photoelectric conversion portion back to the first photoelectric conversion portion, wherein a reflective surface of the second reflective portion protrudes towards the photoelectric conversion layer as a whole and comprises a first reflective surface and a second reflective surface, which are respectively connected to a reflective surface of the first reflective portion on both sides of the second reflective portion, and the reflective surface of the first reflective portion is parallel to a surface of the substrate; each of the first reflective surface and the second reflective surface inclines with respect to the reflective surface of the first reflective portion connected thereto as a whole.

* * * * *